(12) United States Patent
Kozlowski

(10) Patent No.: US 6,538,245 B1
(45) Date of Patent: Mar. 25, 2003

(54) AMPLIFIED CMOS TRANSDUCER FOR SINGLE PHOTON READ-OUT OF PHOTODETECTORS

(75) Inventor: Lester J. Kozlowski, Simi Valley, CA (US)

(73) Assignee: Rockwell Science Center, LLC., Thousand Oaks, CA (US)

( * ) Notice: Subject to any disclaimer, the term of this patent is extended or adjusted under 35 U.S.C. 154(b) by 75 days.

(21) Appl. No.: 09/696,919

(22) Filed: Oct. 26, 2000

(51) Int. Cl.[7] .............................................. H01L 27/00
(52) U.S. Cl. ............................... 250/208.1; 250/214 A; 348/294
(58) Field of Search ...................... 250/214 A, 214 LA, 250/208.1, 214 R; 330/59, 308; 257/290–292; 377/60; 348/294, 297, 300, 301, 308

(56) References Cited

U.S. PATENT DOCUMENTS

| | | |
|---|---|---|
| 4,249,122 A | 2/1981 | Widlar |
| 4,463,383 A | 7/1984 | Soneda et al. |
| 4,466,018 A | 8/1984 | Soneda et al. |
| 4,555,623 A * | 11/1985 | Bridgewater et al. ... 250/214 A |
| 4,676,761 A | 6/1987 | Poujois |
| 4,794,247 A | 12/1988 | Stineman et al. |
| 5,043,820 A | 8/1991 | Wyles et al. |
| 5,055,667 A | 10/1991 | Sayag |
| 5,083,016 A | 1/1992 | Wyles et al. |
| 5,128,534 A | 7/1992 | Wyles et al. |
| 5,146,302 A | 9/1992 | Kumada |
| 5,220,587 A * | 6/1993 | Takemoto et al. ............. 377/57 |
| 5,233,180 A * | 8/1993 | Tsuruta et al. ........... 250/208.1 |
| 5,280,511 A * | 1/1994 | Fujii et al. ..................... 377/60 |
| 5,296,696 A | 3/1994 | Uno |
| 5,345,266 A | 9/1994 | Denyer et al. |
| RE34,802 E | 11/1994 | Sayag et al. |
| 5,382,977 A | 1/1995 | Kozlowski et al. |
| RE34,908 E | 4/1995 | Wyles et al. |
| 5,471,515 A | 11/1995 | Fossum et al. |
| 5,541,402 A | 7/1996 | Ackland et al. |
| 5,576,763 A | 11/1996 | Ackland et al. |
| 5,587,596 A | 12/1996 | Chi et al. |
| 5,608,243 A | 3/1997 | Chi et al. |
| 5,627,112 A | 5/1997 | Tennant et al. |
| 5,665,959 A | 9/1997 | Fossum et al. |
| 5,892,540 A * | 4/1999 | Kozlowski et al. ......... 348/300 |
| 5,929,434 A | 7/1999 | Kozlowski et al. |
| 5,933,190 A | 8/1999 | Dierickx et al. |
| 6,064,431 A | 5/2000 | Ueno |
| 6,069,376 A | 5/2000 | Merrill |
| 6,248,991 B1 * | 6/2001 | Chen et al. ............... 250/208.1 |

OTHER PUBLICATIONS

Chamberlain, S.G. et al. (1984) "A Novel Wide Dynamic Range Silicon Photodetector and Linear Imaging Array," *IEEE Transactions on Electron Devices* ED–31 (2):175–182.

Letter Dated Jul. 31, 1998, From Gene Weckler, RAD–I–CON IMAGING CORP., addressed to Mark Wettler.

(List continued on next page.)

Primary Examiner—Kevin Pyo
Assistant Examiner—Seung C. Sohn
(74) Attorney, Agent, or Firm—Reed Smith Crosby Heafey

(57) ABSTRACT

An ultra-low noise, high-gain interface pixel amplifier is provided with capability for single-photon readout of known photodetectors at high electrical bandwidths for diverse spectral bandpass from the x-ray to long IR bands. The detector charge modulates a source follower whose output is double sampled to remove correlated noise by a compact stage that also facilitates low-noise gain adjustment for a second gain stage of programmable amplification. Single-photon readout of photodetectors at high electrical bandwidths in small pixel areas is thereby facilitated.

38 Claims, 2 Drawing Sheets

OTHER PUBLICATIONS

L.J. Kozlowski, D. Standley, J. Luo. A Tomasini, A. Gallagher, R. Mann, B.C. Hsieh, T. Liu and W.E. Kleinhans, "Theoretical Basis And Experimental Confirmation: Why A CMOS Imager is Superior To A CD", SPIE Conference On Infrared Technology And Applications XXV, Orlando, Fla, Apr. 1999, vol. 369, pp. 388–396.

R.H. Dyck and G.P. Weckler, "Integrated Arrays Of Silicon Photodetectors For Image Sensing,", IEEE Trans. Electron Devices, ED–15, Apr. 1968, pp. 196–201.

J.D. Plummer and J.D. Meindl, "MOS Electronics For A portable Reading Aid For The Blind", IEEE J. Solid–State Circuits, SC–7, Apr. 1972, pp. 111–119.

N. Koikke, I. Takemoto,K. Satoh, S. Hanamura, S. Nagahara and M. Kubo, "MOS Area Sensor: Part 1—Design Consideration And Performance Of An n–p–n Structure 484×384 Element Color MOS Imager", IEEE Trans Electron Devices, ED–27 (8), Aug. 1980,pp. 1676–1681.

S. Ohba, M. Nakai, H. Ando, S. Hanamura, S. Shimada, K. Satoh, K. Takahashi, M. Kubo and T. Fujita, "MOS Area Sensor: Part II—Low–Noise MOS Area Sensor With Antiblooming Photodiodes", IEEE Trans. Electron Devices, ED–27 (8) Aug. 1980, pp. 1682–1687.

EG&G Reticon Sales Catalog, *Image Sensing and Solid State Camera Products 1994/1995.* Solid State Image Sensor Array Specification For Part No.: RA0256B.

EG&G Reticon Sales Catalog, *Image Sensing and Solid State Camera Products 1994/1995. High–Speed*Solid State Image Sensor Array Specification For Part No.: RA2568N.

EG&G Reticon Sales Catalog, *Image Sensing and Solid State Camera Products 1994–1995.* Solid State Sensor Arrays Specification For Part Nos.: RA0100A/RA0128N.

H. Ando, S. Ohba, M. Nakai, T. Ozaki, M. Ozawa, K. Ikeda, T. Masuhara, T. Imaide, I. Takemoto, T. Suzuki and T. Fukita, "Design Consideration And Performance Of A New MOS Imaging Device, "IEEE Trans. On Elec. Dev., ED–32 (8), Aug. 1985, pp. 1484–1489.

N. Tanaka, T. Ohmi and Y. Nakamura, "A Novel Bipolar Imaging Device With Self–Noise Reduction Capability", IEEE Trans. Elec. Dev., 36 (1), Jan. 1989, pp.31–38.

G.P. Weckler, "Storage Mode Operation Of A Phototransistor And Its Adaptation To Integrated Arrays Foe Image Detection", IEDM, Oct. (Abstract Only—No known paper available from professional document delivery services) 1966.

N. Tanaka, T. Ohmi, Y. Nakamura and S. Matsumoto, "A Low–Noise Bi–CMOS Liner Imager Sensor With Auto–Focusing Function", IEEE Trans. Elec. Dev., 36 (1), Jan. 1989, pp. 39–45.

N. Tanaka, S. Hashimoto, M. Shinohara, S. Sugawa, m. Morishita, S. Matsumora, Y. Nakamura and T. Ohmi, A 310k Pixel Bipolar Imager (BASIS), ISSCC 1989.

G.P. Weckler, "Charge Storage Lights The Way For Solid–State Image Sensors", Electronics, May 1, 1967, pp. 75–78.

G.P. Weckler, "Operation of p–n Junction Photodetectors In A Photon Flux Integrating Mode", IEEE Journal Of solid State Circuits, vol. SC–2, No. 3, Sep. 1967, pp.65–73.

G.P. Weckler and R.H. Dyck, "Integrated Arrays Of Silicon Photodetectors For Image Sensing", WESCON, Aug. 22–25, 1967, pp. 1–8.

L.J. Kozlowski, J. Lue, W.E. Kleinhans and T. Lui, "Comparison Of Passive And Active Pixel Schemes For CMOS Visible Imagers", SPIE, vol. 3360, Apr. 1998.

Ming–Jer Chin, Yen–Bin Gu, Terry Wu, Po–Chin Hsu and Tsung–Hann Liu, "Weak Inversion Charge Injection In Analog MOS Switches", IEEE Journal Of Solid–State Circuits, vol. 30, No. 5, May 1995, pp. 604–606.

Peter W. Fry, Peter J. W. Noble and Robert J. Rycroft, "Fixed–Pattern Noise In Photomatrices", IEEE Journal Of Solid–State Circuits, vol. SC–5, No. 5, Oct. 1970, pp. 250–254.

Degrauwe, et al., "A Microppower CMOS–Instrumentation Amplifier", IEEE Journal Of Solid–State Circuits, vol. SC–20, No. 3 Jun. 1985, pp. 805–807.

* cited by examiner

AMPLIFIED CMOS TRANSDUCER FOR SINGLE PHOTON READ-OUT OF PHOTODETECTORS

BACKGROUND OF THE INVENTION

1. Field of the Invention

The present invention relates generally to photon detection, and more particularly to detector amplifiers for single photon read-out of semiconductor photodetectors in pixellated imaging arrays.

2. Description of the Related Art

Optical sensors transform incident radiant signals in the X-ray ($\lambda$<0.001 $\mu$m), ultraviolet ($\lambda$=0.001–0.4 $\mu$m), visible ($\lambda$=0.4–0.8 $\mu$m), near infrared (IR) ($\lambda$=0.8–2 $\mu$m), shortwave IR ($\lambda$=2.0–2.5 $\mu$m), mid IR ($\lambda$=2.5–5 $\mu$m), and long IR ($\lambda$=5–20 $\mu$m) bands into electrical signals that are used for data collection, processing, storage and display, such as real-time video. Available conventional photodetectors such as photodiodes and photoconductors are inexpensive, exhibit bandwidths that support current video frame rates, are sensitive to wavelengths well into the long IR band, and exhibit a high degree of uniformity from pixel to pixel when used in an imaging array. However, these photodetectors have no gain, i.e. each incident photon generates, at most, a single electron. Thus, these imaging systems work well only in moderate to bright light conditions. At low light levels, they provide electrical signals that are too small to be read-out by conventional readout circuits.

In conditions of low ambient light, the standard photodetector is often replaced with an avalanche photodiode that provides significant gain such that conventional read-out circuits, such as charge coupled devices, i.e. CCDs, can read out the amplified signal at video frame rates with a high signal-to-noise ratio (SNR). The fabrication of avalanche photodiodes is much more difficult and expensive than standard photodetectors because they must simultaneously exhibit very high controlled gain and very low noise. Furthermore, currently available avalanche photodiodes exhibit relatively poor uniformity, are constrained to shorter wavelengths than standard photodetectors (0.7 $\mu$m), and have limited sensitivity due to their relatively low quantum efficiency. Imaging intensified systems use an array of avalanche photodiodes or micro-channel plates to drive respective display elements such as CCDs or phosphors, and have even lower wavelength capabilities (approximately 0.6 $\mu$m max) due to the limitations of the photodiode.

Chamberlain et al. "A Novel Wide Dynamic Range Silicon photodetector and Linear Imaging Array" IEEE Transactions on Electron Devices, Vol. ED-31, No. 2, February 1984, pp. 175–182, herein incorporated by reference, describes a gate modulation technique for single photon read-out of standard photodetectors with wide dynamic range. Chamberlain provides a high-gain current mirror that includes a load FET (Field Effect Transistor) whose gate is connected to its drain to ensure sub-threshold operation. The signal from the photodetector is injected into the load FET thereby producing a signal voltage at the gate of a gain FET with high transconductance. This signal modulates the gain FET's gate voltage, which is read out and reset via a FET switch. The key benefit of this approach is that a detecting dynamic range of more than $10^7$ for each detector in the array is produced. Unfortunately, the circuit is highly sensitive to variations in the threshold voltage of the various transistors. The pixel-to-pixel $V_T$ non-uniformity associated with standard silicon CMOS fabrication processes degrades the instantaneous dynamic range of the imaging array even as the circuit's logarithmic characteristic enhances each pixel's ability to operate over a much larger total dynamic range.

Although this specific gain modulation technique is useful for detecting signals across a broad spectral range, the front-end bandwidth severely restricts the imaging array's bandwidth. Specifically, the dominant RC time constant is the parallel combination of the photodetector's capacitance and the resistance of the load FET. In sub-threshold operation, the FETs transconductance is very low and, hence, its load resistance is very large, at $\geq 10^{15}$ ohms; the minimum resulting RC time constant is on the order of tens of seconds. Chamberlain's gate modulation technique is thus only practically useful for imaging daylight scenes or static low-light-level scenes such as stars. Furthermore, to achieve large current gain, the load FET is typically quite small. As a result, the load FET exhibits substantial 1/f noise, which under low light conditions seriously degrades the performance of the imaging array.

U.S. Pat. No. 5,933,190 discloses a circuit having a first reading transistor 23 in series with the load transistor of Chamberlain to read-out the voltage across the load transistor rather than the other leg of the current mirror. While this configuration self-biases the detectors in the imaging array, and the usable dynamic range for each pixel is still at least $10^7$, the time constant is unchanged relative to Chamberlain's teaching. Further, the instantaneous dynamic range at a specific irradiance across an imaging array having pixels of such design is still highly sensitive to the threshold uniformity from transistor to transistor. The pixel-to-pixel $V_T$ non-uniformity associated with standard silicon CMOS fabrication processes degrades the instantaneous dynamic range of the imaging array even as the circuit's logarithmic characteristic enhances each pixel's ability to operate over a much larger total dynamic range. Though the '190 reference also teaches a method for reducing the non-uniformity by degrading the various transistors by applying a stressing over-voltage, this is definitely not a recommended procedure for a high-quality, long-life camera system.

U.S. Pat. No. 5,929,434 teaches an alternative current mirror configuration that suppresses the impact of the $V_T$ non-uniformity via an alternative current mirror configuration that also reads the integrated current after an integration period rather than the instantaneous voltage. The preferred embodiment minimizes, to first order, the variations in threshold non-uniformity by subtracting the non-uniformity within each pixel. Unfortunately, the residual pixel-to-pixel variations still dominate the imager's fixed pattern noise irrespective of background flux, depending on the MOS fabrication technology. The magnitude of pattern noise can often be larger than the signal, so off-chip compensation of pixel-to-pixel non-uniformity is required.

The negative feedback amplifier, 16, disclosed in U.S. Pat. No. 5,929,434, significantly reduces the input impedance of the high-gain circuit and thereby enhances its bandwidth. In the case where the buffer amplifier is approximated to have infinite voltage gain and finite transconductance, the dominant pole is given by:

$$\tau_{B-L} = \frac{C_f}{g_{m_{Q1}}}$$

where $C_f$ is the effective feedback capacitance of the buffer amplifier from its output to its input. Assuming a cascoded amplifier configuration, the gate-source capacitance of Q1 (FET 74) is dominant and $C_f$ is set by the gate-to-source capacitance of the sub-threshold Q1 (FET 74). This is approximately given by the parasitic metal overlap capacitance. Assuming a minimum width transistor in 0.25 μm CMOS technology, for example, the minimum $C_f$ will be approximately 0.2 fF for transistors having minimum width. The resulting time constant is on the order of tenths of a second. Though this facilitates single photon sensing at roughly video frame rates, additional improvements are needed to truly support single-photon imaging at frame rates higher than typically used for standard video.

U.S. Pat. No. 5,665,959 teaches yet another approach consisting of a digitized system wherein each pixel uses a pair of cascaded inverters with a sub-threshold transistor at its front-end to generate extremely high transimpedance. Since the small photosignal at backgrounds on the order of one electron translates to extremely high input impedance, the photosignal is effectively integrated onto the Miller capacitance of a first-stage inverter prior to being further amplified by a second stage inverter. A resulting charge-to-voltage conversion gain >1 mV/e– is hence claimed. Nevertheless, the read noise of the charge-integrating first stage will limit the SNR for many practical cases since insufficient means are provided to band-limit the first amplifier's wideband noise. The read noise for the first stage can be approximated as similar to that of a charge integrator such that:

$$N_{\text{stage\_1}} = \frac{1}{q}\sqrt{kTC_{fb} \cdot \frac{C_{det} + C_{fb}}{C_L + \frac{C_{fb} \cdot C_{det}}{C_{fb} + C_{det}}}}$$

where k is Boltzmann's constant, T is the temperature, $C_{fb}$ is the parasitic feedback capacitance of the first stage, $C_{det}$ is the photodiode capacitance and $C_L$ is the load capacitance at the amplifier's output. Assuming practical values consistent with the understanding of those skilled in the art, the detector capacitance is typically a minimum of 15 fF for the hybrid imager of the U.S. Pat. No. 5,665,959 preferred embodiment. Assuming a Miller capacitance for the first stage amplifier of 5 fF and a load capacitance of 350 fF (i.e., the storage capacitance $C_{str1}$), then the minimum read noise for the first stage will be in the range of 6 to 7 e–; this is on top of the kT/C noise generated by opening transistor switch $Q_{sw1}$ to perform the offset compensation of the composite two-stage amplifier. This performance is very good, but does not facilitate photon counting. Further, while the clocking of the two-stage amplifier facilitates large reductions in amplifier non-uniformity, this invention does not suppress the threshold variations of the load resistor at the front end.

U.S. Pat. No. 6,069,376 teaches a pixel amplifier with a speed switch suitable for still camera applications. This apparatus provides high-bandwidth signal integration with downstream gain, but its sensitivity is limited by the generation of reset noise at the storage element. Also, no facility is provided for maximizing the signal's dynamic range at the input to the amplifier.

SUMMARY OF THE INVENTION

In general, the present invention is a photodetector readout circuit, with extremely high sensitivity, capable of single-photon detection. A photodetector (preferably a photodiode) integrates a small-signal photocharge on the detector capacitance in response to incident photons, producing a photodetector output signal. A buffer amplifier is arranged to receive the photodetector output signal and to produce a buffered photodetector output signal. A coupling capacitor has a first terminal connected to the buffered output signal and a second terminal connected to a signal input of a signal amplifier. The coupling capacitor shifts a signal level at the input to the signal amplifier by an adjustable offset voltage. An electronic offset reset switch, connected to the coupling capacitor, allows resetting of the offset voltage, preferably just after reset of the photodiode to allow transient decay. The offset voltage is the reset noise (kTC) generated by resetting the detector capacitance.

To synchronize the start of image formation across a pixellated array, the reset is simultaneous across the entire array. Each pixel's offset voltage is clamped across each pixel's coupling capacitor by reading the specific detector's voltage, while simultaneously clamping the coupling capacitor to a specified voltage. When sampling of the photodiode signal begins, the actual signal is read relative to the offset voltage stored across the coupling capacitor. This effects correlated double sampling of the photogenerated signal, and eliminates the correlated noise generated by resetting (discharging) the photodetector capacitance. The clamping voltage is an adjustable voltage that also sets the quiescent operating point of the video signal amplifier above the threshold voltage of an integrating gain stage having common gate configuration and noise bandwidth set by a reset integrator.

The common gate amplifier provides large, adjustable current gain to further amplify the low-noise signal and integrate the boosted signal in a dedicated integration capacitor. At the end of a specified integration time, the integrated signal is sampled onto a second capacitor to synchronize the end of signal integration. Snapshot image capture is thus provided with very low noise referred back to the photodetector. The invention thereby improves transimpedance and dynamic range relative to prior solutions.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to detector amplifier circuits for single photon read-out of semiconductor photodetectors in pixellated imaging arrays. Any and all such modifications, equivalents and alternatives are intended to fall within the spirit and scope of the present invention.

The present invention provides a high bandwidth, ultra low-noise pixel amplifier that is capable of single photon read-out of photodetectors in extremely low-light conditions, i.e. photon flux levels approaching zero photons per sampling period. This circuit can be used to effectively count incident photons on individual photodetectors, either in an imaging array as the front-end to a conventional video system or in high frame-rate wavefront sensors. One of the primary benefits of the approach is that the circuit can use off-the-shelf photodetectors such as photodiodes or photoconductors that have gain ≦1 rather than, for example, avalanche multiplication within the photodiode. Such known photodetectors with gain ≦1 are cheaper, more uniform, easier to fabricate, more reliable, less susceptible to excess noise mechanisms within the detector, and support a much broader range of the electromagnetic spectrum than avalanche photodiodes.

Figure 1:
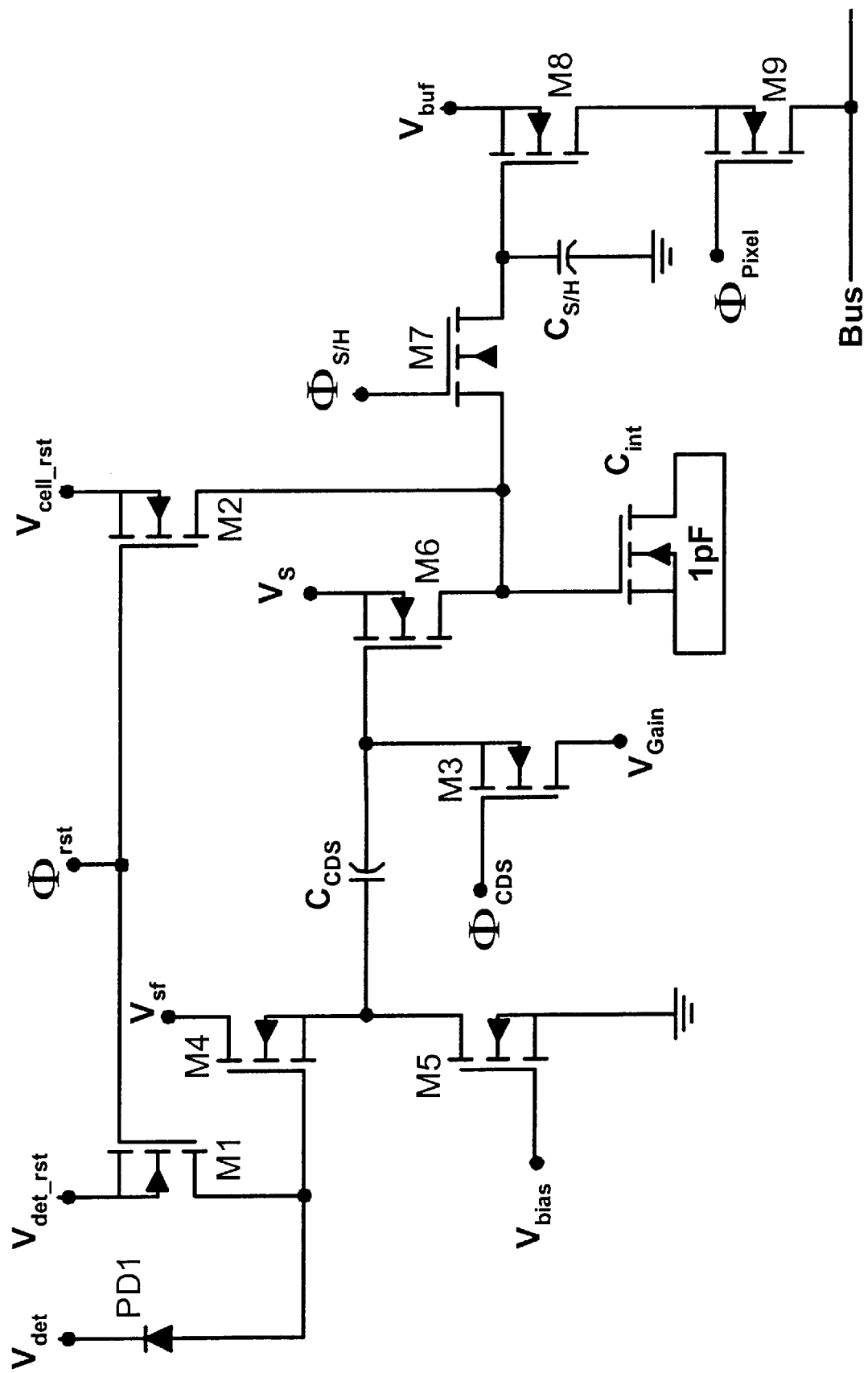
FIG. 1 is a schematic diagram of a generalized pixel amplifier in accordance with the present invention.

The generalized circuit in accordance with the present invention is shown in FIG. 1. Before photodetection begins, enabling switch transistors M1 and M2 initializes the circuit to synchronize the subsequent start of signal integration across the pixellated array. In this initial state, any photo-generated charge on $C_{pd}$ (which represents the capacitance of photodiode PD1) is discharged (reset) and the detector voltage is set to $V_{det}$-$V_{det\_rst}$. Further, the signal integration capacitor, $C_{int}$, is set to $V_{cell\_rst}$. Transistors M1 and M2 are subsequently disabled to allow the associated voltage transients to decay. Switch transistor M3 is then enabled to clamp $C_{CDS}$ to $V_{Gain}$. This process stores each pixel's reset noise across $C_{CDS}$ and sets the starting quiescent voltage for the front-end amplifier. The front-end amplifier comprises a source follower buffer amplifier formed by transistors M4 and M5, the correlated double sampling capacitor $C_{CDS}$, and a switch transistor M3. By subsequently disabling switch transistor M3, the video signal established by the difference between the buffered photodetector signal and the clamped offset voltage subsequently modulates the gate of gain transistor M6. Transistor M6 is a common gate amplifier that supplies an adjustable current to integration transistor $C_{int}$. This current is adjusted by setting the difference between $V_{Gain}$-$V_s$ and the threshold voltage of M6 since the source of M6 ($V_s$) is preferably operated at, or near, 0V to minimize pickup of bias-induced noise from the source terminal of M6. $V_s$ is thus preferably set at ground for basic operation.

The current integrated in $C_{int}$ is therefore a gain-proportioned facsimile of the photo-generated signal originally applied to source follower amplifier transistor M4. At the end of the prescribed integration time, switch transistor M7 is briefly enabled to store the signal voltage on the sample-and-hold capacitor $C_{S/H}$. This signal voltage modulates the gate of a second source follower amplifier transistor M8. The final signal voltage is read on a row-by-row basis to produce the video signal by enabling the switch transistor M9 via the $\Phi_{pixel}$ clock. The current sink for transistor M8 is typically common to all the pixels in each column and shared in this manner to minimize the power dissipation and the demand on support circuitry.

The output of the source follower transistor M4 is capacitively coupled by a series capacitor $C_{CDS}$ initially, under control of a reset signal $\Phi_{CDS}$ applied to the gate of M3 at the start of integration. The clamping and sampling facilitated in this manner effects correlated double sampling of the photogenerated signal. This signal is essentially free of circuit-induced noise except for the 1/f noise of transistor M3. The correlated noise generated by resetting the detector capacitance is thereby eliminated. By minimizing the capacitances of PD1 and the gate of transistor M4, the basic transimpedance can be maximized to first order to minimize the required size of the capacitor $C_{CDS}$. To facilitate sub-electron read noise, the value of $C_{CDS}$ must, at a minimum, be at least several femtofarads for operation at room temperature (295 K).

The clamping circuit comprising the capacitor $C_{CDS}$ and switch transistor M3, also effects a compact method for arbitrarily setting the minimum signal level at a quiescent operating point for compatibility with exercising either a portion of the available dynamic range, or the full dynamic range of the common gate amplifier. The clamping circuit thus provides both correlated double sampling and dynamic range management when the source terminal of transistor M6 is either connected to an externally accessible pad to enable external adjustment or biased by an adjustable on-chip reference voltage.

Since the transimpedance established by the combined capacitance of the detector and amplifier transistor M4 does not facilitate reading noise levels <10 e− at typical video rates, the present invention uses the level-shifting stage in conjunction with the common gate amplifier to effect large overall transimpedance. For example, the combined total capacitance of the photodetector and the gate of MOSFET M4 will practically be, at a minimum, ≧5 fF. The maximum photoconversion gain defined at the input to the compact amplifier is thus 32 μV/e−. Because the minimum read noise referred to the output needs to be from 250 μV to >1 mV in practical video cameras, the ability to detect quanta requires additional gain of from 10 to 30, at a minimum. Optimally adjusting the gate-to-source voltage by appropriately adjusting $V_{GAIN}$ provides this additional gain. The output of the low-noise pixel amplifier is read from the pixel by enabling $\Phi_{pixel}$ to supply the signal to the bus via the switch transistor M9.

Figure 2:
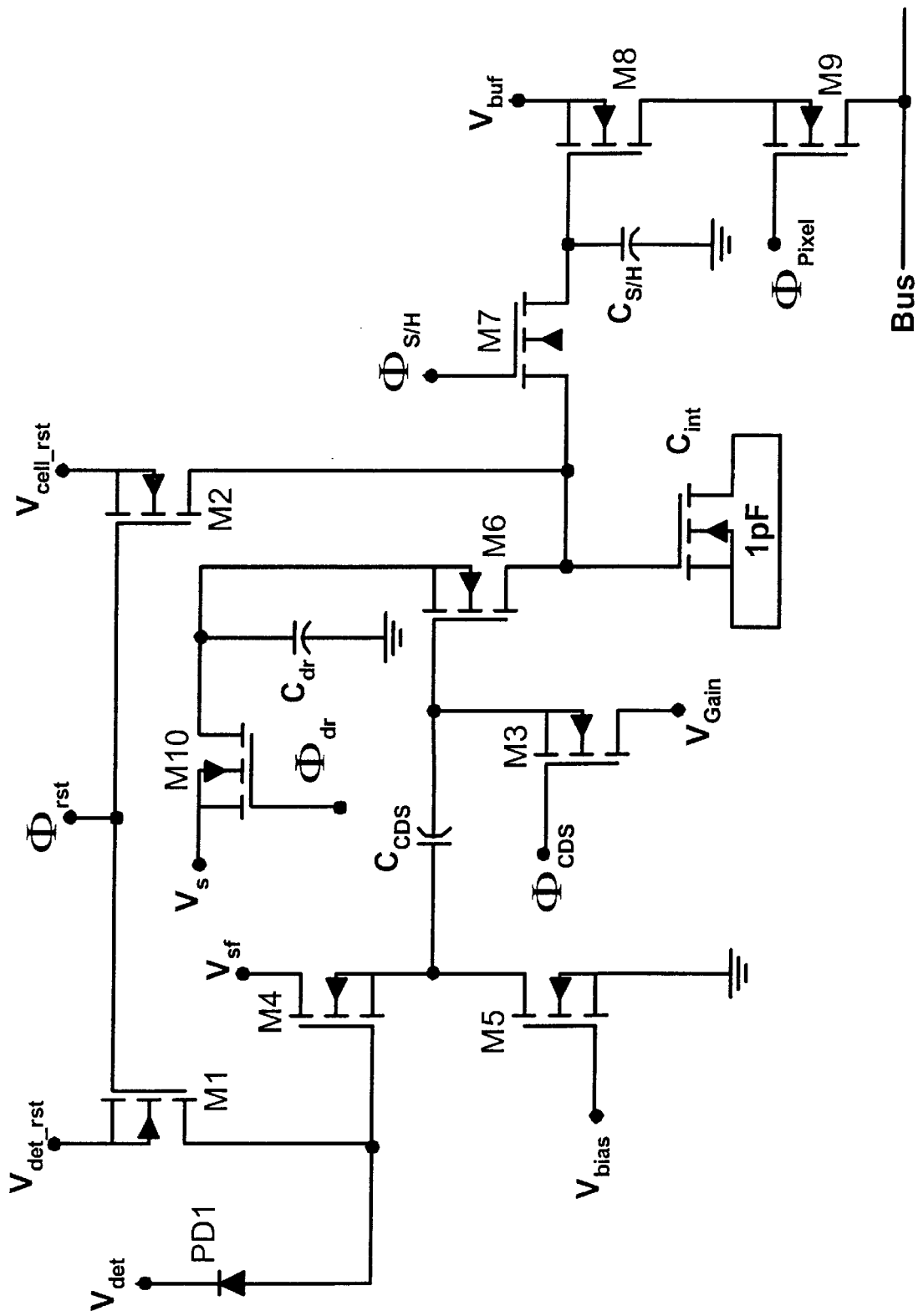
FIG. 2 is a schematic diagram of an alternative embodiment of the present invention in which the pixel amplifier enhances the instantaneous dynamic range and minimizes amplifier nonuniformity in exchange for lower transimpedance.

FIG. 2 is a schematic circuit diagram of an alternative embodiment wherein the instantaneous dynamic range is increased from a maximum of about 10 bits to larger values depending on effective resistance of a switched-capacitor resistor placed at the source of common gate transistor M10. The programmable switched-capacitor resistor comprises transistor M10 and capacitor $C_{dr}$ and reduces the gain of common gate amplifier M6 by adding a series resistance to the supply $V_s$. This source resistance increases the dynamic range and reduces the impact of the threshold voltage nonuniformity of transistor M10 in the pixellated array in exchange for lower overall transimpedance and adjustability. Alternatively, a high value fixed-resistor (0.5 to 50 MΩ) can replace transistor M10 and capacitor $C_{dr}$ if a specific dynamic range or amplifier transimpedance is needed. The required value for the effective series resistance is that it acts as a current source. In order to do this, it must have a higher impedance than transistor M10. Looking into its source terminal, the resistance of transistor M10 is given by:

$$R_{M10} = \frac{1}{g_m + g_d}$$

where $g_m$ is the FET transconductance and $g_d$ is the drain conductance. In weak inversion or subthreshold operation, the resistance is thus $g_m^{-1}$; the resistance is $g_d^{-1}$ in the linear region.

The ultra-low noise amplifiers of the present invention thus provide a total transimpedance that is approximately:

$$Z_{T,Amp} = \frac{t_{int}}{C_{det} + C_{input}} \cdot \frac{q\Delta V_{sig}}{nkT} \cdot \frac{C_{int}}{C_{det} + C_{input}} \cdot A_{atten}$$

where $t_{int}$ is the integration time, $C_{int}$ is the integration capacitance, $C_{det}$ is the detector capacitance, $C_{input}$ is the combined capacitance of the source follower transistor and any other capacitances at this node, both stray and intentional, q is the electron charge, $\Delta V_{sig}$ is the integrated signal voltage programmed by tuning $V_{gain}$-$V_s$, n is the subthreshold ideality of transistor M6, k is Boltzmann's constant, T is the temperature, and $A_{atten}$ is the attenuation facilitated by the series resistor. For the preferred embodiment, $A_{atten}$=1. The compact amplifier's gain is thus adjustable to compensate for transimpedance degradations resulting from either short integration time or large detector capacitance. The amplifier's gain can also be very large since $\Delta V_{sig}$ can be much larger than the thermal voltage of transistor M10 and capacitor $C_{int}$ is often 10X to 100X larger than the sum ($C_{det}$+$C_{input}$). Nevertheless, for those sensors having large detector capacitance the former can still effect gains exceeding 100X.

The attenuation factor in the preceding equation is defined:

$$A_{atten} = \frac{R_{M10}}{R_{M10} + R_{SCR}}$$

where $R_{SCR}$ is the effective resistance of the switched-capacitor resistor of the alternative embodiment. The preferred embodiment thus has no attenuation, i.e., $A_{atten}$=1 and the alternative embodiment can have attenuations from 1 to greater than 100.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. A single-photon read-out circuit, comprising:
   a photodetector producing a photodetector output signal;
   a buffer amplifier, arranged to receive the photodetector output signal, having a buffered photodetector output signal;
   a signal amplifier having a signal input and a signal output;
   a coupling capacitor, having a first terminal connected to the buffered output signal and a second terminal connected to the signal input of the signal amplifier;
   an electronic offset reset switch, connected to the coupling capacitor; and
   a synchronization circuit connected to an input of the buffer amplifier and to the signal output of the signal amplifier.

2. The circuit of claim 1, further comprising an integration capacitor connected to the signal output of the signal amplifier.

3. The circuit of claim 2, further comprising a sample-and-hold circuit connected to the signal output of the signal amplifier.

4. The circuit of claim 3, further comprising an output amplifier connected to the sample-and-hold circuit.

5. The circuit of claim 4, further comprising a variable current source connected to the signal amplifier.

6. The circuit of claim 5, wherein the buffer amplifier comprises two MOSFETs arranged in a source follower configuration.

7. The circuit of claim 6, wherein the signal amplifier comprises a MOSFET.

8. The circuit of claim 7, wherein the offset reset switch comprises a MOSFET.

9. The circuit of claim 8, wherein the synchronization circuit comprises two MOSFETs having a reset signal connected to each gate.

10. The circuit of claim 9, wherein the sample-and-hold circuit comprises a MOSFET and a capacitor.

11. The circuit of claim 10, wherein the variable current source comprises a MOSFET and a capacitor.

12. A single-photon read-out circuit, comprising:
    a photodetector that integrates a small-signal photocharge on a detector capacitance in response to incident photons, producing a photodetector output signal;
    a buffer amplifier, arranged to receive the photodetector output signal and to produce a buffered photodetector output signal;
    a signal amplifier having a signal input and producing a signal output;
    a coupling capacitor, having a first terminal connected to the buffered output signal and a second terminal connected to the signal input of the signal amplifier, to shift a signal level by an offset voltage;
    an electronic offset reset switch, connected to the coupling capacitor, for resetting the offset voltage; and
    a synchronization circuit connected to an input of the buffer amplifier and to the output signal of the signal amplifier to synchronize a start of signal integration across a pixellated array.

13. The circuit of claim 12, further comprising a sample-and-hold circuit for storing a signal voltage.

14. The circuit of claim 13, further comprising a variable current source connected to the signal amplifier for increasing an instantaneous dynamic range of the circuit.

15. A signal read-out circuit comprising:
    a photodetector connected to a detector voltage;
    a first MOSFET having a gate connected to the photodetector, and a drain connected to a first voltage;
    a second MOSFET having a drain connected to a source of the first MOSFET, and a gate connected to a first bias voltage;
    a correlated double sampling capacitor having a first terminal connected to the source of the first MOSFET;
    a signal amplifier MOSFET having a gate connected to a second terminal of the correlated double sampling capacitor, and a source connected to a second voltage;
    an electronic offset reset switch MOSFET having a source connected to the second terminal of the correlated double sampling capacitor, a drain connected to a gain voltage, and a gate connected to a correlated double sampling signal;
    an integration capacitor connected to the drain of the signal amplifier MOSFET;
    a sample-and-hold MOSFET having a source connected to the drain of the signal amplifier MOSFET, and a gate connected to a sample-and-hold signal; and
    a sample-and-hold capacitor connected to a drain of the sample-and-hold MOSFET.

16. The circuit of claim 15, further comprising:
a first reset MOSFET having a drain connected to the gate of the first MOSFET, a gate connected to a reset signal, and a source connected to a detector reset voltage; and
a second reset MOSFET having a drain connected to the drain of the signal amplifier, a gate connected to the reset signal, and a source connected to a cell reset voltage.

17. The circuit of claim 16, further comprising:
an amplifier MOSFET having a source connected to a buffer voltage, a gate connected to the drain of the sample-and-hold MOSFET; and
an access MOSFET having a source connected to a drain of the amplifier MOSFET, a gate connected to an access signal, and a drain connected to a bus.

18. The circuit of claim 15, further comprising:
a dynamic range MOSFET having a drain connected to the source of the signal amplifier MOSFET, a source connected to a source voltage, and a gate connected to a dynamic range signal; and
a dynamic range capacitor connected to the drain of the dynamic range MOSFET.

19. A single-photon read-out circuit, comprising:
a photodetector producing a photodetector output signal current;
a buffer amplifier, arranged to receive the photodetector output signal current, having a buffered photodetector output signal;
a coupling capacitor, having a first terminal connected to the buffered output signal;
a variable gain signal amplifier having a signal input connected to the coupling capacitor and a signal output connected to an integration capacitor; and
an electronic offset reset switch having a variable reset level, connected to the coupling capacitor;
wherein the integration capacitor integrates an amplified facsimile of the photodetector output signal current, and wherein the electronic offset reset switch adjusts signal amplification in the variable gain signal amplifier.

20. The circuit of claim 19, further comprising a synchronization circuit connected to an input of the buffer amplifier and to the signal output of the variable gain signal amplifier.

21. The circuit of claim 20, further comprising a sample-and-hold circuit connected to the signal output of the variable gain signal amplifier.

22. The circuit of claim 21, further comprising an output amplifier connected to the sample-and-hold circuit.

23. The circuit of claim 22, further comprising a variable current source connected to the variable gain signal amplifier.

24. The circuit of claim 23, wherein the buffer amplifier comprises two MOSFETs arranged in a source follower configuration.

25. The circuit of claim 24, wherein the variable gain signal amplifier comprises a MOSFET.

26. The circuit of claim 25, wherein the offset reset switch comprises a MOSFET.

27. The circuit of claim 26, wherein the synchronization circuit comprises two MOSFETs having a reset signal connected to each gate.

28. The circuit of claim 27, wherein the sample-and-hold circuit comprises a MOSFET and a capacitor.

29. The circuit of claim 28, wherein the variable current source comprises a MOSFET and a capacitor.

30. A single-photon read-out circuit, comprising:
a photodetector that integrates a small-signal photocharge on a detector capacitance in response to incident photons, producing a photodetector output signal current;
a buffer amplifier, arranged to receive the photodetector output signal current and to produce a buffered photodetector output signal;
a coupling capacitor, having a first terminal and a second terminal, the first terminal connected to the buffered output signal, wherein the coupling capacitor shifts a DC level of the buffered photodetector output signal;
a variable gain signal amplifier having a signal input connected to the coupling capacitor and a signal output connected to an integration capacitor, wherein the integration capacitor integrates an amplified facsimile of the photodetector output signal current; and
an electronic offset reset switch, connected to the coupling capacitor, for variably resetting the offset voltage to modify the gain of the variable gain signal amplifier.

31. The circuit of claim 30, further comprising a synchronization circuit connected to an input of the buffer amplifier and to the output signal of the variable gain signal amplifier to synchronize a start of signal integration across a pixellated array.

32. The circuit of claim 31, further comprising a sample-and-hold circuit for storing a signal voltage.

33. The circuit of claim 32, further comprising a variable current source connected to the signal amplifier for increasing an instantaneous dynamic range of the circuit.

34. A signal read-out circuit comprising:
a photodetector connected to a detector voltage;
a first MOSFET having a gate connected to the photodetector, and a drain connected to a first voltage;
a second MOSFET having a drain connected to a source of the first MOSFET, and a gate connected to a first bias voltage;
a correlated double sampling capacitor having a first terminal connected to the source of the first MOSFET;
a signal amplifier MOSFET having a gate connected to a second terminal of the correlated double sampling capacitor, and a source connected to a variable voltage;
an electronic offset reset switch MOSFET having a source connected to the second terminal of the correlated double sampling capacitor, a drain connected to a variable reset voltage, and a gate connected to a correlated double sampling signal; and
an integration capacitor connected to the drain of the signal amplifier MOSFET, wherein the integration capacitor integrates an amplified facsimile of a signal current from the photodetector.

35. The circuit of claim 34, further comprising:
a sample-and-hold MOSFET having a source connected to the drain of the signal amplifier MOSFET, and a gate connected to a sample-and-hold signal; and
a sample-and-hold capacitor connected to a drain of the sample-and-hold MOSFET.

36. The circuit of claim 35, further comprising:
a first reset MOSFET having a drain connected to the gate of the first MOSFET, a gate connected to a reset signal, and a source connected to a detector reset voltage; and
a second reset MOSFET having a drain connected to the drain of the signal amplifier, a gate connected to the reset signal, and a source connected to a cell reset voltage.

37. The circuit of claim 36, further comprising:

an amplifier MOSFET having a source connected to a buffer voltage, a gate connected to the drain of the sample-and-hold MOSFET; and an access MOSFET having a source connected to a drain of the amplifier MOSFET, a gate connected to an access signal, and a drain connected to a bus.

38. The circuit of claim 34, further comprising:

a dynamic range MOSFET having a drain connected to the source of the signal amplifier MOSFET, a source connected to a source voltage, and a gate connected to a dynamic range signal; and a dynamic range capacitor connected to the drain of the dynamic range MOSFET.

* * * * *